(12) United States Patent
Nogiwa et al.

(10) Patent No.: US 10,340,654 B2
(45) Date of Patent: Jul. 2, 2019

(54) LASER APPARATUS AND EXTREME ULTRAVIOLET LIGHT GENERATING SYSTEM

(71) Applicant: Gigaphoton Inc., Tochigi (JP)

(72) Inventors: Seiji Nogiwa, Oyama (JP); Yasufumi Kawasuji, Oyama (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 16/052,659

(22) Filed: Aug. 2, 2018

(65) Prior Publication Data

US 2018/0342849 A1  Nov. 29, 2018

Related U.S. Application Data

(63) Continuation of application No. PCT/JP2016/060214, filed on Mar. 29, 2016.

(51) Int. Cl.
*H01S 3/00* (2006.01)
*H01S 3/131* (2006.01)
(Continued)

(52) U.S. Cl.
CPC .......... *H01S 3/1312* (2013.01); *G02F 1/0136* (2013.01); *H01S 3/005* (2013.01); *H01S 3/0085* (2013.01); *H01S 3/042* (2013.01); *H01S 3/0405* (2013.01); *H01S 3/0407* (2013.01); *H01S 5/06804* (2013.01); *H05G 2/008* (2013.01); *G02F 2203/48* (2013.01); *H01S 3/0941* (2013.01); *H01S 3/10069* (2013.01);
(Continued)

(58) Field of Classification Search
CPC .... H01S 3/1312; H01S 3/0085; H01S 3/1611; H01S 3/0407; H01S 3/1305; H01S 3/042; H01S 3/1673; H01S 3/0405; H01S 3/0941; H01S 3/131; H01S 3/227; H01S 5/068; H05G 2/008; G02F 1/0136; G02F 2203/48
USPC ....................................... 250/504 R
See application file for complete search history.

(56) References Cited

U.S. PATENT DOCUMENTS

| | | | | |
|---|---|---|---|---|
| 2006/0056470 A1* | 3/2006 | Liu | ............... | H01S 3/13 372/38.1 |
| 2016/0087389 A1* | 3/2016 | Niwano | ............... | H01S 3/10015 250/504 R |
| 2016/0316551 A1* | 10/2016 | Kurosawa | ............... | H01S 3/2232 |

FOREIGN PATENT DOCUMENTS

| | | | |
|---|---|---|---|
| JP | H01-125567 U | | 8/1989 |
| JP | H10-294513 | * | 4/1998 |

(Continued)

OTHER PUBLICATIONS

International Search Report issued in corresponding International Application No. PCT/JP2016/060214; dated Jun. 21, 2016.
International Preliminary Report on Patentability issued in corresponding International Application No. PCT/JP2016/060214; dated Oct. 2, 2018.

*Primary Examiner* — Michael Maskell
(74) *Attorney, Agent, or Firm* — Studebaker & Brackett PC

(57) ABSTRACT

A laser apparatus includes a light source configured to output excitation light, an optical resonator in which laser medium is excited by the excitation light, the optical resonator being configured to output laser beam, a temperature regulator configured to adjust temperature of the light source to a standard temperature, an optical detector configured to detect output power of the laser beam, and a controller configured to change the standard temperature based on the detected output power of the laser beam.

12 Claims, 10 Drawing Sheets

(51) Int. Cl.
*G02F 1/01* (2006.01)
*H01S 3/04* (2006.01)
*H01S 3/042* (2006.01)
*H05G 2/00* (2006.01)
*H01S 5/068* (2006.01)
*H01S 3/0941* (2006.01)
*H01S 3/13* (2006.01)
*H01S 3/16* (2006.01)
*H01S 5/024* (2006.01)
*H01S 3/10* (2006.01)

(52) U.S. Cl.
CPC ........... *H01S 3/1301* (2013.01); *H01S 3/1305* (2013.01); *H01S 3/1306* (2013.01); *H01S 3/1611* (2013.01); *H01S 3/1673* (2013.01); *H01S 5/02423* (2013.01)

(56) References Cited

FOREIGN PATENT DOCUMENTS

| | | |
|---|---|---|
| JP | H10-294513 A | 11/1998 |
| JP | 2001-094184 A | 4/2001 |
| JP | 2002-198592 A | 7/2002 |
| JP | 2010-239039 A | 10/2010 |
| JP | 2012-042630 A | 3/2012 |
| JP | 2013-030672 A | 2/2013 |
| JP | 2016-015599 A | 1/2016 |
| WO | 2015/118687 A1 | 8/2015 |
| WO | WO-2015118687 A1 * | 8/2015 ........... H01S 3/2232 |

* cited by examiner

LASER APPARATUS AND EXTREME ULTRAVIOLET LIGHT GENERATING SYSTEM

TECHNICAL FIELD

The present disclosure relates to a laser apparatus and an extreme ultraviolet light generating system.

BACKGROUND ART

In recent years, as semiconductor processes become finer, transfer patterns for use in photolithography of semiconductor processes have rapidly become finer. In the next generation, micro-fabrication at 20 nm or less would be demanded. It is thus expected to develop an exposure apparatus in which an extreme ultraviolet (EUV) light generating apparatus for generating extreme ultraviolet light at a wavelength of approximately 13 nm is combined with a reduced projection reflective optical system.

Three types of EUV light generating apparatuses have been proposed, which include an LFP (laser produced plasma) type apparatus using plasma generated by irradiating a target with a laser beam, a DPP (discharge produced plasma) type apparatus using plasma generated by an electric discharge, and an SR (synchrotron radiation) type apparatus using synchrotron radiation.

Patent Document 1: Japanese Patent Application Publication No. 2010-239039 A

Patent Document 2: Japanese Patent Application Publication No. 2012-042630 A

SUMMARY

A laser apparatus according to an aspect of the present disclosure may include a light source configured to output excitation light, an optical resonator in which lasermediumis excited by the excitation light, the optical resonator being configured to output laser beam, a temperature regulator configured to adjust temperature of the light source to a standard temperature, an optical detector configured to detect output power of the laser beam, and a controller configured to change the standard temperature based on the detected output power of the laser beam.

An extreme ultraviolet light generating system according to an aspect of the present disclosure to irradiate a target with a laser beam to generate extreme ultraviolet light may include a laser apparatus configured to output the laser beam, and a chamber that the laser beam enters, the extreme ultraviolet light being generated in the chamber. The laser apparatus may include a light source configured to output excitation light, an optical resonator in which laser medium is excited by the excitation light, the optical resonator being configured to output the laser beam, a temperature regulator configured to adjust temperature of the light source to a standard temperature, an optical detector configured to detect output power of the laser beam, and a controller configured to change the standard temperature based on the detected output power of the laser beam.

BRIEF DESCRIPTION OF DRAWINGS

Embodiments of the present disclosure will be described below as mere examples with reference to the appended drawings.

DESCRIPTION OF EMBODIMENTS

Contents
1. Description of Terms
2. Problem
2.1 Configuration of Comparative Example
2.2 Operation of Comparative Example
2.3 Problem
3. First Embodiment
3.1 Configuration
3.2 Operation
3.3 Effect
3.4 First Modified Example
3.5 Second Modified Example
4. Second Embodiment
4.1 Configuration
4.2 Operation
4.3 Effect
4.4 Modified Example
5. Third Embodiment
5.1 Configuration and Operation
5.2 Effect
6. Fourth Embodiment
6.1 Configuration
6.2 Operation
6.3 Effect
7. Others Embodiments of the present disclosure will be described in detail below with reference to the drawings. The embodiments described below indicate several examples of the present disclosure and do not intend to limit the content of the present disclosure. Not all of the configurations and operations described in the embodiments are indispensable in the present disclosure. Identical reference symbols are assigned to identical constituent elements and redundant descriptions thereof are omitted.

1. Description of Terms

A "target" is an object to be irradiated with a laser beam in a chamber. The target irradiated with the laser beam is turned into plasma to emit light including EUV light.

A "plasma generation region" is a predetermined region in the chamber. The plasma generation region is a region where the target outputted to the chamber is irradiated with the laser beam and is turned into plasma.

A "trajectory of a target" is a path where the target outputted to the chamber travels. The trajectory of the target may intersect an optical path of the laser beam, having entered the chamber, at the plasma generation region.

An "optical path axis" is an axis passing through the center of a cross-section of the laser beam in a traveling direction of the laser beam.

An "optical path" is a path where the laser beam passes. The optical path may include the optical path axis.

A "Z-axis direction" is a direction in which the laser beam travels toward the plasma generation region after entering the chamber. The Z-axis direction may be a direction in which the EUV light generating apparatus outputs the EUV light.

A "Y-axis direction" is a direction opposite to a direction in which a target supply unit outputs the target to the chamber. The Y-axis direction is a direction perpendicular to both an X-axis direction and the Z-axis direction.

The "X-axis direction" is a direction perpendicular to both the Y-axis direction and the Z-axis direction.

2. Problem 2.1 Configuration of Comparative Example

A configuration of a laser apparatus according to a comparative example is described below with reference to FIGS. 1 and 2.

Figure 1:
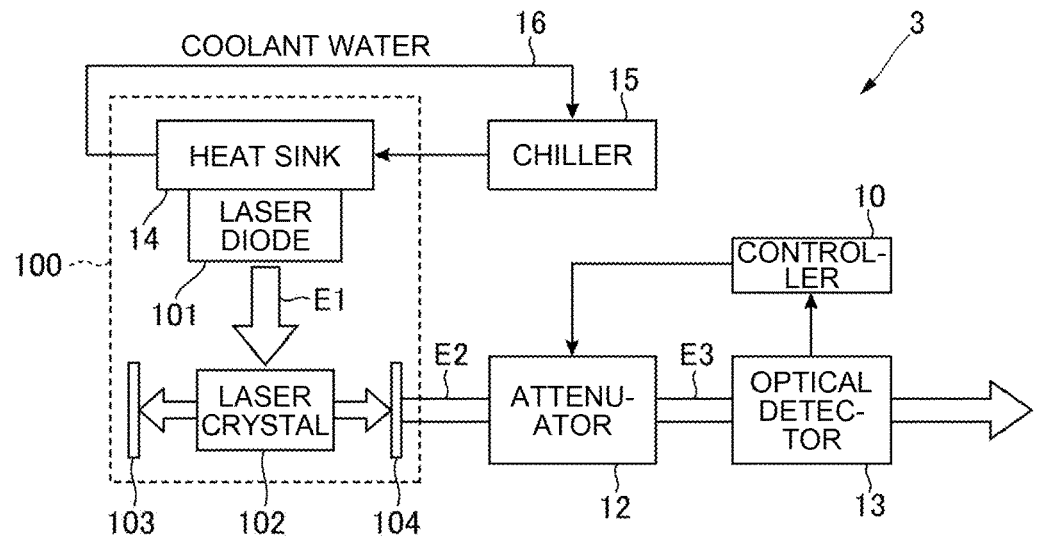
FIG. 1 shows a laser apparatus according to a comparative example.
Figure 2:
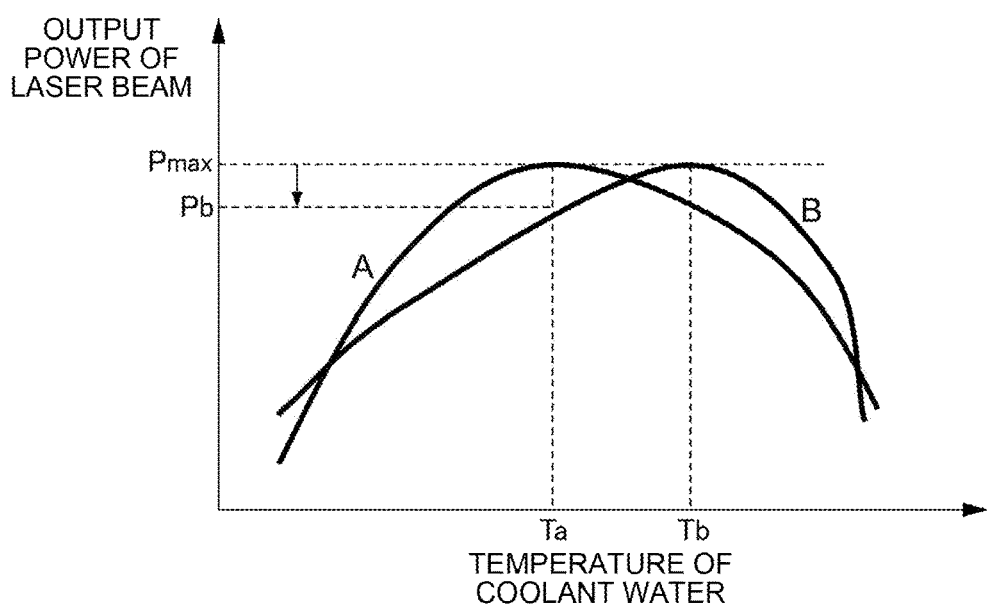
FIG. 2 shows a relationship between output power of a laser beam from the laser apparatus according to the comparative example and temperature of coolant water supplied by a chiller.

FIG. 1 shows a laser apparatus 3 according to the comparative example. FIG. 2 shows a relationship between output power of a laser beam from the laser apparatus 3 according to the comparative example and the temperature of coolant water supplied by a chiller 15.

The laser apparatus 3 of the comparative example includes a laser light source unit 100, a controller 10, an attenuator 12, an optical detector 13, a heat sink 14, the chiller 15, and a coolant water channel 16.

The laser light source unit 100 is a solid laser light source. The laser light source unit 100 includes a laser diode 101, a laser crystal 102, and resonator mirrors 103 and 104. The resonator mirrors 103 and 104 constitute an optical resonator in which the laser crystal 102 is provided between the resonator mirrors 103 and 104. Alternatively, the laser light source unit 100 may include an optical resonator configured by mirrors that form a ring-shaped circulating optical path, for example, instead of the resonator mirrors 103 and 104. Alternatively, the laser light source unit 100 may include a multiplex resonator configured by three or more resonator mirrors 103 and 104.

The laser diode 101 constitutes a light source of the present disclosure. The laser diode 101 outputs excitation light E1 to excite the laser crystal 102.

The laser crystal 102 is a laser medium. Light emitted from the laser crystal 102 resonates in the optical resonator. The laser crystal 102 is a crystal of, for example, Nd:YVO$_4$ (neodymium-doped yttrium orthovanadate).

The resonator mirrors 103 and 104 are provided on opposite sides of the laser crystal 102 in the respective emitting directions of the light from the laser crystal 102. The resonator mirror 103 is a high-reflective mirror to reflect the light from the laser crystal 102 at a high reflectance. The resonator mirror 104 is a partially reflective mirror to reflect a part of the light from the laser crystal 102 and transmit another part. The light transmitted by the resonator mirror 104 constitutes a laser beam E2 outputted from the laser light source unit 100.

The attenuator 12 is controlled to change its transmittance for the laser beam E2 outputted from the laser light source unit 100 to limit the output power of the laser beam. The unit of the output power of the laser beam is watt [W]. The attenuator 12 is provided in the optical path of the laser hear E2. The attenuator 12 may be configured by, for example, a Pockels cell and a polarizer. The Pockels cell changes the polarizing direction of the laser beam E2 according to the voltage applied to the Pockels cell.

The optical detector 13 detects the output power of a laser beam E3 transmitted by the attenuator 12 and outputs a detection signal according to the output power of the laser beam E3. The optical detector 13 is provided in an optical path of the laser beam E3 transmitted by the attenuator 12.

The controller 10 controls the voltage applied to the attenuator 12 based on the detection signal from the optical detector 13 to change the transmittance of the attenuator 12. The controller 10 further controls an unillustrated electric power source connected to the laser diode 101.

The heat sink 14 is thermally connected to the laser diode 101 constituting a heat source. The heat sink 14 releases heat from the laser diode 101. The heat sink 14 may be a microchannel type heat sink including fine flow paths of a heat exchange medium.

The chiller 15 is a heat exchanger to perform heat exchanging to cool the heat exchange medium from the heat sink 14. The chiller 15 constitutes a temperature regulator of the present disclosure. The chiller 15 uses, for example, coolant water as the heat exchange medium. The heat sink 14 gives heat from the laser diode 101 to the coolant water supplied by the chiller 15. The temperature of the laser diode 101 is thus adjusted to a preset temperature. The preset temperature is a temperature to allow, for example, the laser light source unit 100 to output the laser beam E2 at a maximum output power The coolant water channel 16 is a pipe to circulate the coolant water from the heat sink 14 to the chiller 15 and from the chiller 15 to the heat sink 14.

2.2 Operation of Comparative Example

The controller 10 controls the electric power source connected to the laser diode 101 to control the electric current supplied to the laser diode 101. The laser diode 101 outputs the excitation light E1 according to the electric current supplied from the electric power source. The laser diode 101 outputs the excitation light E1, which excites the laser crystal 102.

The excitation light E1 from the laser diode 101 raises the gain in the laser crystal 102 at a predetermined wavelength.

The laser light source unit 100 performs a laser oscillation when the gain in the laser crystal 102 at the predetermined wavelength increases to exceed the loss in the optical resonator. The laser light source unit 100 thus performing the laser oscillation outputs the laser beam E2 through the resonator mirror 104.

The attenuator 12 transmits the laser beam E2 according to the transmittance that has been set by the controller 10. The optical detector 13 detects the output power of the laser beam E3 transmitted by the attenuator 12. The optical detector 13 sends the detection signal to the controller 10 according to the detected output power.

The controller 10 sends a signal to the attenuator 12 to limit the output power of the laser beam E3 based on the detection signal from the optical detector 13.

The chiller 15 circulates the coolant water to and from the heat sink 14. The chiller 15 adjusts the temperature of the coolant water to the preset temperature to cool the laser diode 101 connected to the heat sink 14.

2.3 Problem

In the laser apparatus 3 according to the comparative example, the output power of the laser beam E2 changes according to the output power of the excitation light E1 from the laser diode 101. Further, the output power of the excitation light E1 changes according to the temperature of the laser diode 101. Here, the laser diode 101 is connected to the heat sink 14 and the temperature is controlled using the chiller 15. Accordingly, there is a correlation where the output power of the laser beam E2 changes according to the temperature of the coolant water supplied by the chiller 15.

In the laser apparatus 3 according to the comparative example, a change in the output condition of the laser beam E2 described below causes a change in the relationship shown in FIG. 2 between the output power of the laser beam E2 from the laser apparatus and the temperature of the coolant water supplied by the chiller 15. The change in the output condition of the laser beam E2 includes, for example, change in characteristics of the laser diode 101, change in resonance condition, change in heat release characteristics of the heat sink 14, and the like. The change in the output condition of the laser beam E2 causes the relationship between the output power of the laser beam E2 and the temperature of the coolant water to change, for example, from the relationship shown by a curve A to the relationship shown by a curve B. The temperature of the coolant water where the laser beam E2 has a maximum output power Pmax thus changes, for example, from Ta to Tb.

In the laser apparatus 3 according to the comparative example, the chiller 15 adjusts the temperature of the coolant water to a preset temperature Ta. Accordingly, the change in the output condition of the laser beam E2 causes reduction of the output power of the laser beam E2 from Pmax described above to Pb. There is a problem in that the change in the output condition of the laser beam E2 makes it difficult to achieve a desired output power of the laser beam E2 such as the maximum output power Pmax in a stable manner.

3. First Embodiment

3.1 Configuration

A configuration of a laser apparatus 3 according to a first embodiment is described below with reference to FIGS. 3 and 4.

Figure 3:
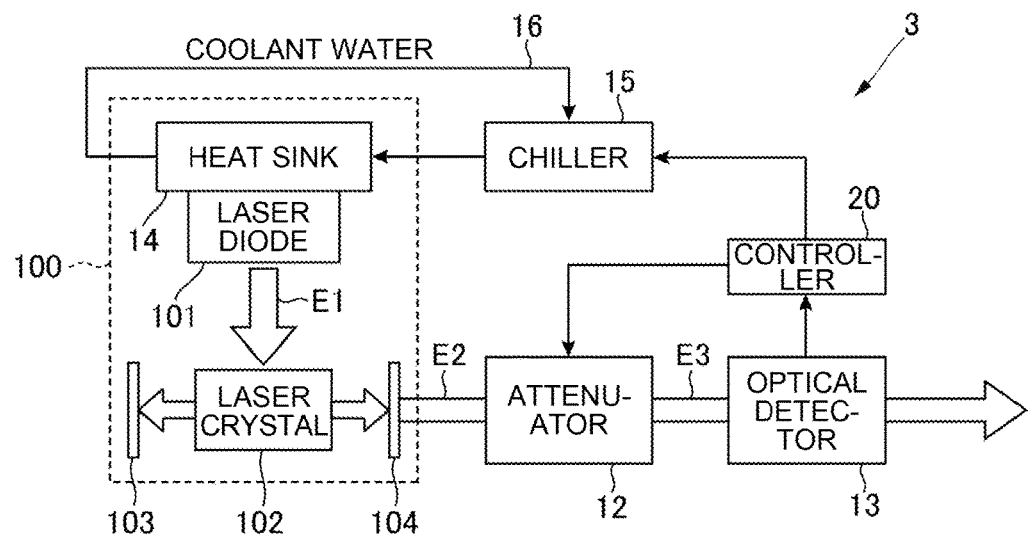
FIG. 3 shows a laser apparatus according to a first embodiment.
Figure 4:
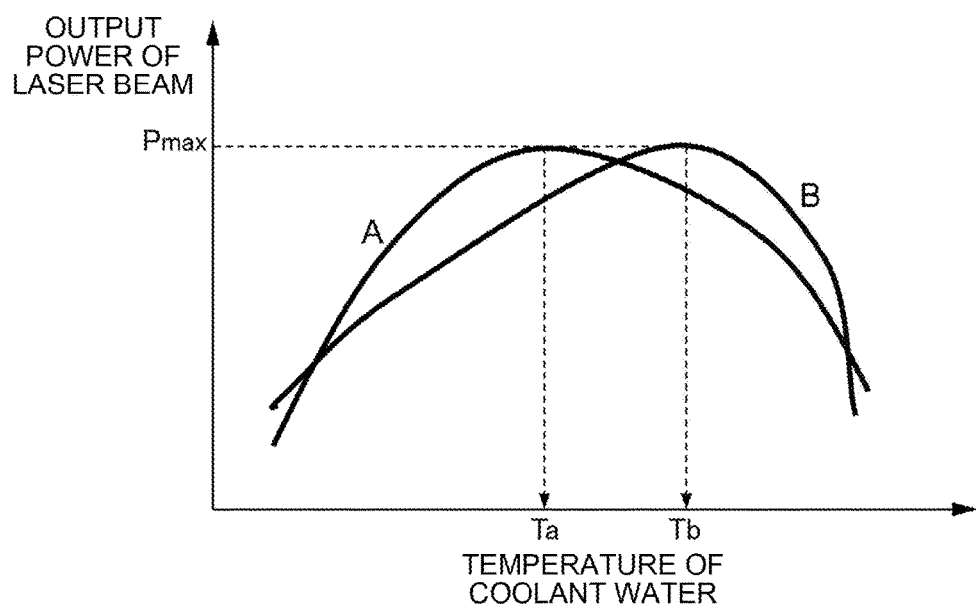
FIG. 4 shows a relationship between output power of a laser beam from the laser apparatus according to the first embodiment and temperature of coolant water supplied by the chiller.

FIG. 3 shows the laser apparatus 3 according to the first embodiment. FIG. 4 shows a relationship between the output power of a laser beam from the laser apparatus 3 according to the first embodiment and the temperature of the coolant water supplied by the chiller 15.

The laser apparatus 3 according to the first embodiment shown in FIG. 3 includes a controller 20 instead of the controller 10 in the laser apparatus 3 shown in FIG. 1.

Similarly to the controller 10, the controller 20 controls the voltage applied to the attenuator 12 based on the detection signal from the optical detector 13 to change the transmittance of the attenuator 12. The controller 20 also controls an unillustrated electric power source connected to the laser diode 101.

The controller 20 further performs a process of keeping the output power of the laser beam. The process of keeping the output power of the laser beam includes changing a standard temperature, which is set for the chiller 15 to adjust the temperature of the coolant water, and sending a new standard temperature to the chiller 15. The standard temperature is set based on the detection signal from the optical detector 13.

As described above, the output power of the laser beam E2 changes according to the temperature of the coolant water supplied by the chiller 15. Accordingly, the controller 20 changes the standard temperature of the coolant water set for the chiller 15 based on the relationship between the output power of the laser beam E2 and the temperature of the coolant water. To change the standard temperature, the controller 20 acquires the relationship between the output power of the laser beam E2 and the temperature of the coolant water. If the relationship between the output power of the laser beam E2 and the temperature of the coolant water changes, for example, from the relationship shown by the curve A to the relationship shown by the curve B as shown in FIG. 4, the controller 20 changes the standard temperature from Ta to Tb such that the output power of the laser beam E2 reaches a desired output power such as the maximum output power Pmax. In a predetermined situation, for example, where the detected output power of the laser beam E2 is equal to or lower than a threshold output power, the controller 20 changes the standard temperature.

In the laser apparatus 3 according to the first embodiment, the optical detector 13 detects the output power of the laser beam E3 that has passed through the attenuator 12. The output power of the laser beam E3 is limited by the attenuator 12, and thus different from the output power of the laser beam E2 outputted from the laser light source unit 100. Accordingly, the controller 20 calculates the output power of the laser beam E2 based on the detected output power of the laser beam E3 and the transmittance of the attenuator 12 for the laser beam E2.

In other aspects, the configuration of the laser apparatus 3 according to the first embodiment is substantially the same as the configuration of the laser apparatus 3 shown in FIG. 1. A description is omitted for the aspects that are substantially the same as the configuration of the laser apparatus 3 shown in FIG. 1.

3.2 Operation

The process of keeping the output power of the laser beam performed by the laser apparatus 3 according to the first embodiment is described below with reference to FIG. 5.

Figure 5:
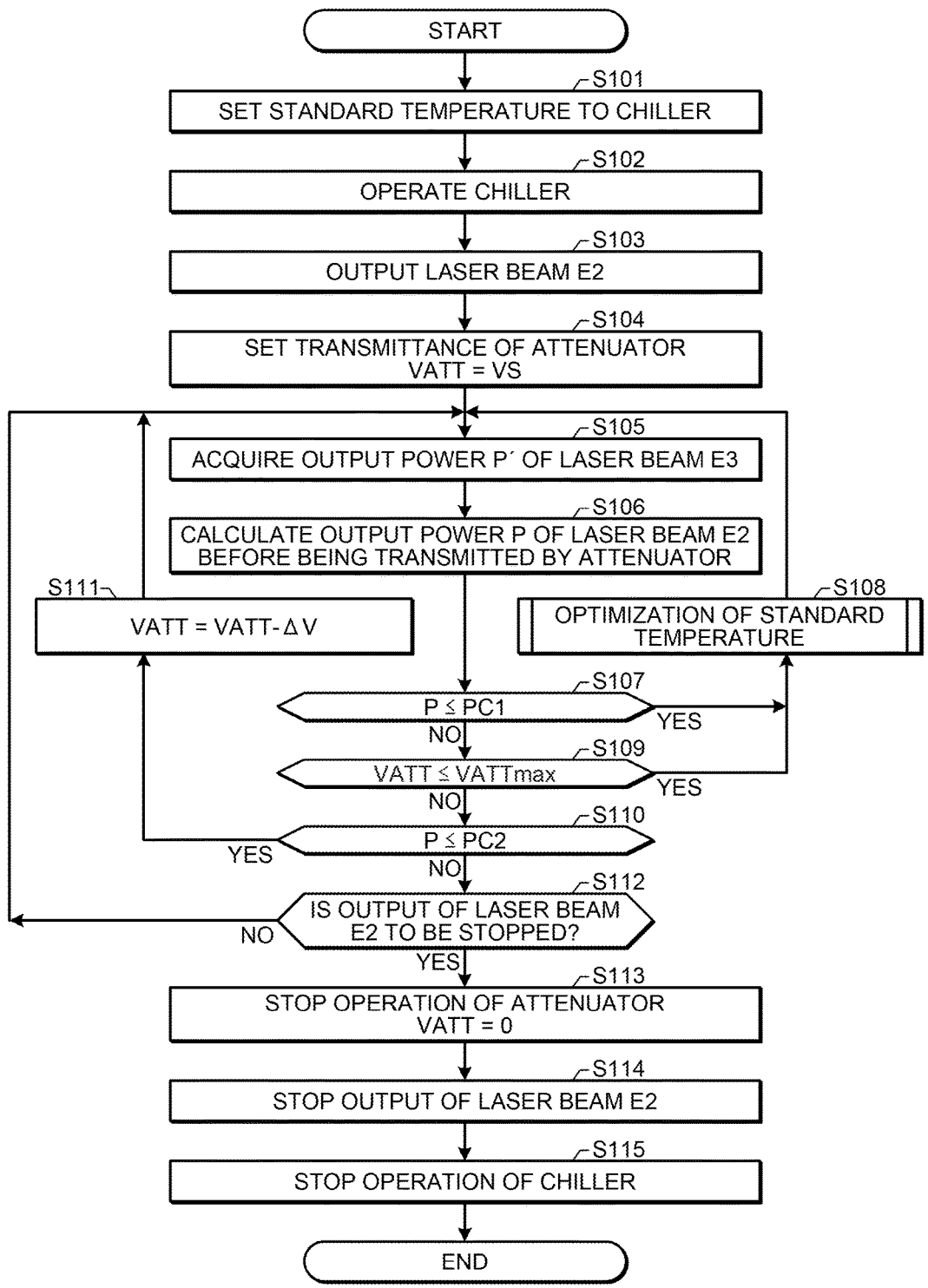
FIG. 5 is a flowchart of a process of keeping the output power of the laser beam from the laser apparatus according to the first embodiment.

FIG. 5 is a flowchart of the process of keeping the output power of the laser beam performed by the laser apparatus 3 according to the first embodiment.

The controller 20 sets the standard temperature to the chiller 15 (S101). The standard temperature to be set here is an initial value of the temperature of the coolant water where the output power of the laser beam E2 from the laser light source unit 100 reaches the maximum output power Pmax.

The controller 20 then operates the chiller 15 such that the temperature of the coolant water is adjusted to the standard temperature (8102). The controller 20 controls the electric power source connected to the laser diode 101 such that the laser light source unit 100 outputs the laser beam E2 (S103).

The controller 20 sets an applied voltage VATT applied to the attenuator 12 to a standard voltage VS to set the transmittance of the attenuator 12 (S104).

The optical detector 13 detects the output power P' of the laser beam E3 that has passed through the attenuator 12. The optical detector 13 outputs the detection signal according to the output power P' of the laser beam E3. The controller 20 receives the detection signal outputted from the optical detector 13 to acquire data on the output power P' of the laser beam E3 (S105)

The controller 20 calculates the output power P of the laser beam E2, based on the received detection signal of the laser beam E3 and the transmittance of the attenuator 12 (S106). The output power P of the laser beam E2 can be calculated by Formula 1 below using the output power P' of the laser beam E3 and the transmittance O of the attenuator 12.

$$P=P'/O \quad \text{Formula 1}$$

The controller 20 determines whether the output power P of the laser beam E2 calculated by Formula 1 is equal to or lower than a threshold output power PC1 (S107). The threshold output power PC1 has, for example, a value of 80 of the maximum output power Pmax of the laser beam E2.

If the output power P of the laser beam E2 calculated by Formula 1 is equal to or lower than the threshold output power PC1 (S107: YES), the controller 20 performs a process of optimization of the standard temperature (S108). A flowchart of the process of optimization of the standard temperature will be described below. After the process of optimization of the standard temperature, the controller 20 returns to the process of S105.

If the output power P of the laser beam E2 calculated by Formula 1 is higher than the threshold output power PC1 (S107: NO), the controller 20 determines whether or not the applied voltage VATT applied to the attenuator 12 is equal to or lower than a voltage VATTmax where the transmittance of the attenuator 12 has a maximum value (S109).

If the applied voltage VATT is equal to or lower than the voltage VATTmax (S109: YES), the controller 20 performs the process of optimization of the standard temperature (S108).

If the applied voltage VATT is higher than the voltage VATTmax (S109: NO), the controller 20 determines whether or not the output power P of the laser beam E2 calculated by Formula 1 is equal to or lower than a second threshold output power PC2 (S110). The second threshold output power PC2 is higher than the threshold output power PC1 and lower than the maximum output power Pmax. The second threshold output power PC2 has, for example, a value of 99% of the maximum output power Pmax of the laser beam E2.

If the calculated output power P of the laser beam E2 is equal to or lower than the second threshold output power PC2 (S110: YES), the controller 20 decreases the applied voltage VATT by a predetermined applied voltage change amount ΔV to raise the transmittance of the attenuator 12 (S111). After raising the transmittance of the attenuator 12, the controller 20 returns to the process of S105.

If the calculated output power P of the laser beam E2 is higher than the second threshold output power PC2 (S110: NO), the controller 20 determines whether it has received a command of stopping the output of the laser beam E2 (S112).

If the controller 20 has received the command of stopping the output of the laser beam E2 (S112: YES), the controller 20 sets the applied voltage VATT applied to the attenuator 12 to 0 to stop the operation of the attenuator 12 (S113). After stopping the operation of the attenuator 12, the controller 20 stops the output of the laser beam E2 from the laser light source unit 100 (S114), then stops the operation of the chiller 15 (S115), and ends the process of this flowchart.

If the controller 20 has not received the command of stopping the output of the laser beam E2 (S112: NO), the controller 20 returns to the process of S105.

The process of optimization of the standard temperature of the coolant water supplied by the chiller 15 is described below with reference to FIG. 6.

Figure 6:
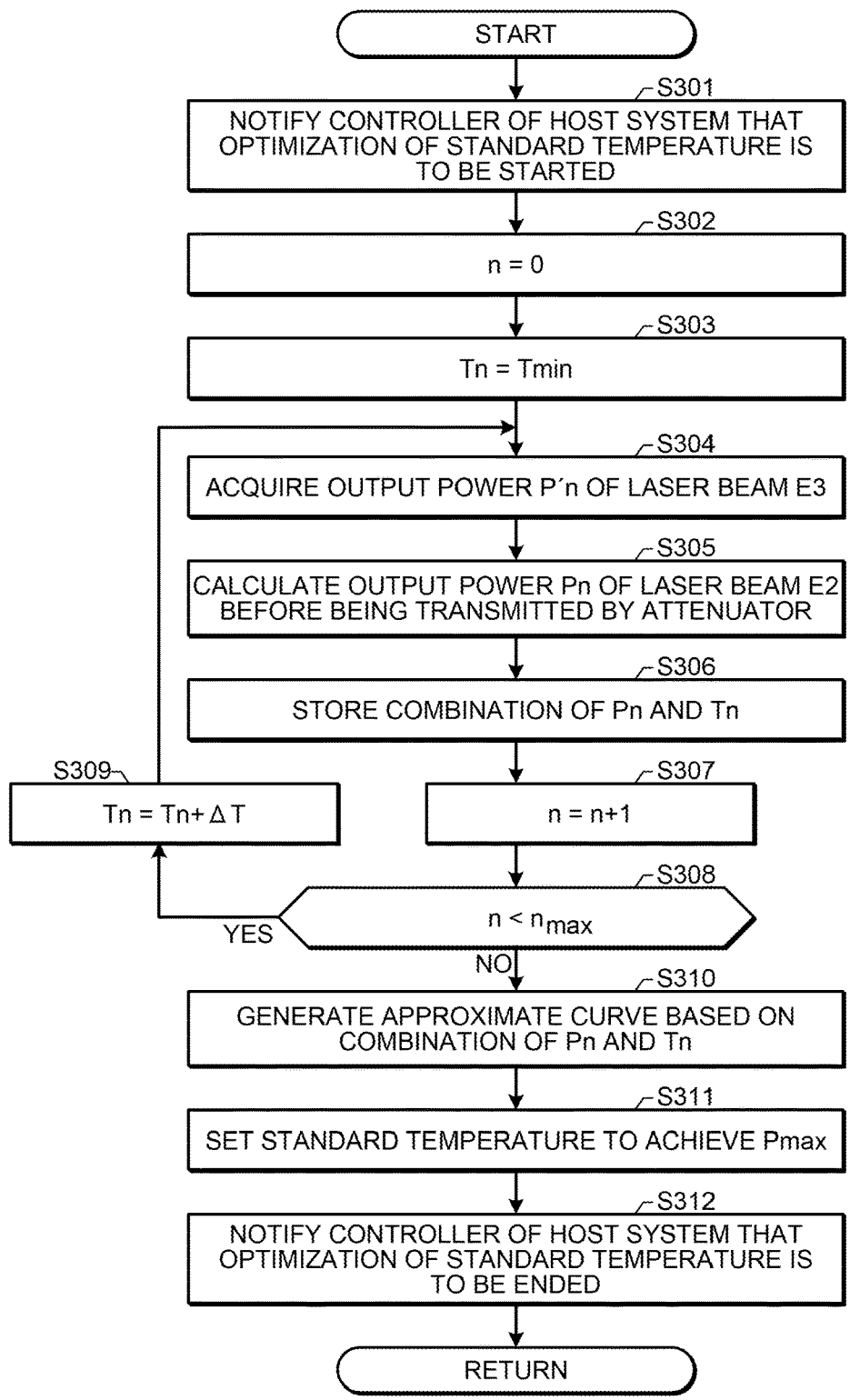
FIG. 6 is a flowchart of a process of optimization of the standard temperature of the coolant water set for the chiller in the process of keeping the output power of the laser beam shown in FIG. 5.

FIG. 6 is a flowchart of the process of optimization of the standard temperature of the coolant water supplied by the chiller 15 in the process of keeping the output power of the laser beam shown in FIG. 5.

The controller 20 notifies a controller of an unillustrated host system such as an EUV light generating system that the process of optimization of the standard temperature is to be started (S301).

The controller 20 then resets the number of times n of detecting the output power P' of the laser beam E3 having passed through the attenuator 12 to 0 (S302). The controller 20 sets a preset temperature Tn of the coolant water to a minimum value Tmin of the preset temperature (S303).

The optical detector 13 detects an output power P'n of the laser beam E3 having passed through the attenuator 12. The optical detector 13 outputs the detection signal according to the output power P'n of the laser beam E3. The controller 20 receives the detection signal outputted from the optical detector 13 to acquire data on the output power P'n of the laser beam E3 (S304).

The controller 20 calculates the output power Pn of the laser beam E2 based on the output power P'n of the laser beam E3 and the transmittance O of the attenuator 12 (S305). The output power Pn of the laser beam E2 is calculated by Formula 2 below.

$$Pn=P'n/O \quad \text{Formula 2}$$

The controller 20 stores a combination of the output power Pn of the laser beam E2 calculated by Formula 2 and the preset temperature Tn of the coolant water (S306). After storing the combination of the output power Pn of the laser beam E2 and the preset temperature Tn of the coolant water, the controller 20 adds 1 to the number of times n (S307).

The controller 20 determines whether the number of times n that has increased by 1 is less than the maximum number of times $n_{max}$ (S308).

If the number of times n is less than the maximum number of times $n_{max}$ (S308: YES), the controller 20 performs a process of raising the preset temperature Tn by ΔT (S309). Here, ΔT may be calculated by Formula 3 below based on, for example, the minimum and maximum values Tmin and Tmax of the preset temperature of the coolant water and the maximum number of times $n_{max}$.

$$\Delta T=(T\max-T\min)/n_{max} \quad \text{Formula 3}$$

After changing the standard temperature, the controller 20 repeats the process from S304 to S308 to calculate the output power Pn of the laser beam E2 for the maximum number of times $n_{max}$.

If the number of times n has reached the maximum number of times n (S308: NO), the combination of the output power Pn of the laser beam E2 and the preset temperature Tn of the coolant water has been acquired for the maximum number of time $n_{max}$. The controller 20 generates, based on the combination of the output power Pn of the laser beam E2 and the preset temperature Tn of the coolant water acquired for the maximum number of times $n_{max}$, an approximate curve as shown in FIG. 4 (S310).

The controller 20 sets, based on the approximate curve generated from the relationship between the output power Pn of the laser beam E2 and the preset temperature Tn of the coolant water, a new standard temperature to achieve the maximum output power Pmax of the laser beam E2 (S311).

The controller 20 notifies the controller of the host system that the process of optimization of the standard temperature is to be ended, and then ends the process (S312).

In other aspects, the operation of the laser apparatus 3 according to the first embodiment is substantially the same as the operation of the laser apparatus 3 shown in FIG. 1. For the laser apparatus 3 according to the first embodiment, a description of the operation substantially the same as the operation of the laser apparatus 3 shown in FIG. 1 is omitted.

In the laser apparatus 3 according to the first embodiment, a description is made using the attenuator 12 in which a decrease in the applied voltage VATT causes an increase in the transmittance. However, in an alternative configuration, an increase in the applied voltage VATT may cause an increase in the transmittance. In either case, the controller 20 changes the standard temperature based on the results of comparing the applied voltage VATT of the attenuator 12 with the voltage VATTmax. If an attenuator 12 in which an increase in the applied voltage VATT causes an increase in the transmittance is used, the process of S109 and Sill in FIG. 5 may be changed to that suitable for such attenuator 12.

3.3 Effect

The laser apparatus 3 according to the first embodiment changes the standard temperature based on the relationship between the output power P of the laser beam E2 and the temperature of the coolant water supplied by the chiller 15. Even where the output condition of the laser beam E2 changes, a desired output power such as the maximum output power Pmax of the laser beam E2 may be stably achieved.

Further, the laser apparatus 3 according to the first embodiment, which changes the standard temperature of the coolant water supplied by the chiller 15, may achieve a desired output power such as the maximum output power Pmax of the laser beam E2.

Even where the maximum output power Pmax cannot be achieved by changing the transmittance of the attenuator 12, the laser apparatus 3 according to the first embodiment may achieve a desired output power of the laser beam E2 by changing the standard temperature of the coolant water supplied by the chiller 15. Namely, the laser apparatus 3 according to the first embodiment, which adjusts the transmittance of the attenuator 12 and the standard temperature of the coolant water supplied by the chiller 15 in harmony, may achieve the desired output power of the laser beam E2.

Furthermore, the laser apparatus 3 according to the first embodiment may calculate the output power P of the laser beam E2 before being transmitted by the attenuator 12 based on the output power P', detected by the optical detector 13, of the laser beam E3 transmitted by the attenuator 12.

3.4 First Modified Example

Figure 7:
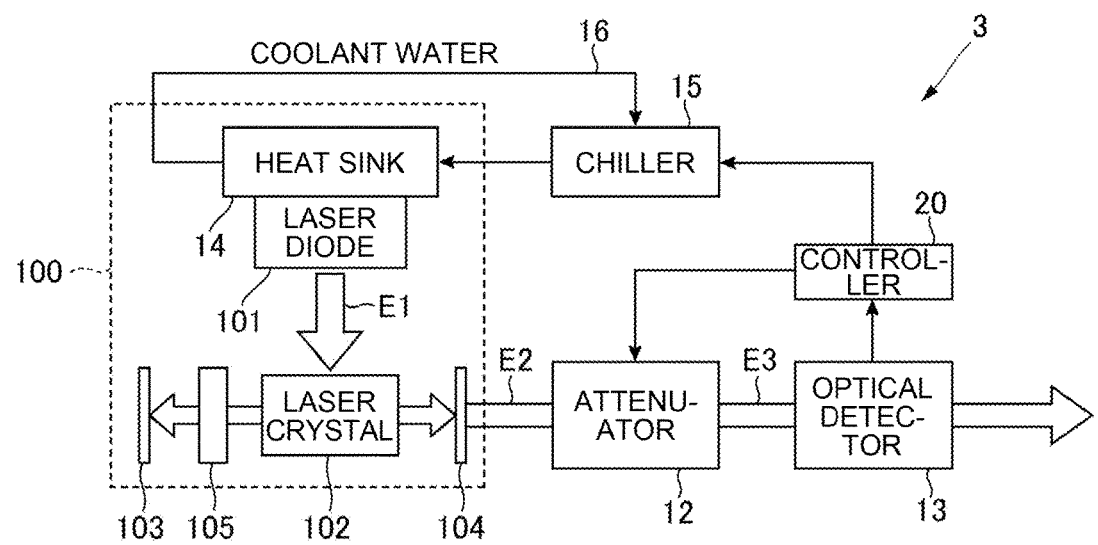
FIG. 7 shows a first modified example of the laser apparatus according to the first embodiment.

FIG. 7 shows a first modified example of the laser apparatus 3 according to the first embodiment.

As in the first modified example of the first embodiment shown in FIG. 7, the laser apparatus 3 may be a passively mode-locked laser apparatus. The laser apparatus 3 includes a saturable absorber 105 in an optical path between the resonator mirror 103 and the laser crystal 102 of the optical resonator of the laser light source unit 100.

When the laser light source unit 100 performs a laser oscillation, the saturable absorber 105 functions as an optical switch to open and close automatically according to the condition of the passively mode-locking of the optical resonator. The laser light source unit 100 with the saturable absorber 105 is capable of outputting a pulsed laser beam. E2 through the resonator mirror 104.

In other aspects, the configuration and operation of the laser apparatus 3 of the first modified example are substantially the same as those of the laser apparatus 3 shown in FIG. 3. For the laser apparatus 3 according to the first modified example, a description of the configuration and operation substantially the same as those of the laser apparatus 3 shown in FIG. 3 is omitted.

3.5 Second Modified Example

Figure 8:
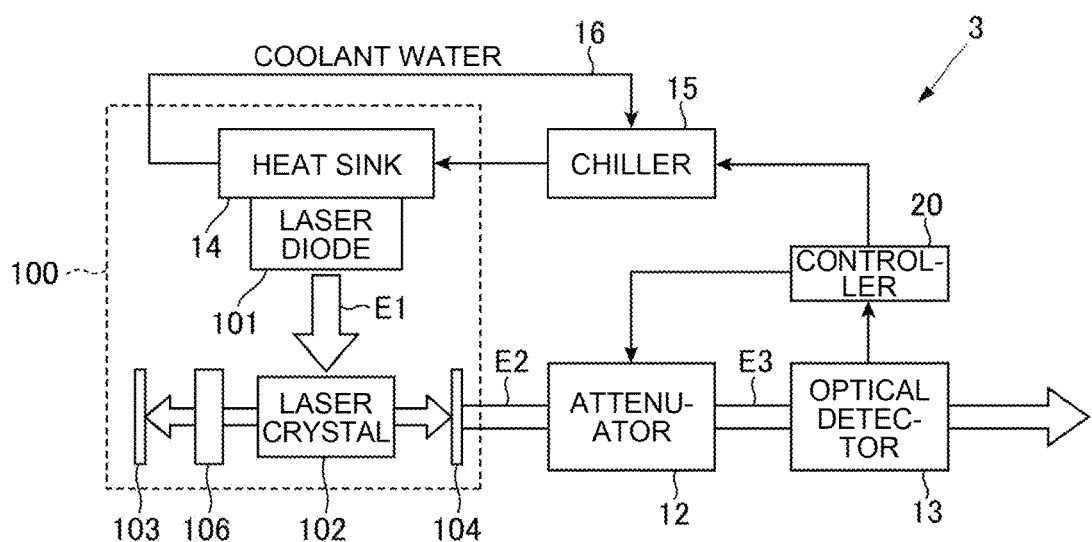
FIG. 8 shows a second modified example of the laser apparatus according to the first embodiment.

FIG. 8 shows a second modified example of the laser apparatus 3 according to the first embodiment.

As in the second modified example shown in FIG. 8, the laser apparatus 3 may be a Q-switched laser. The laser apparatus 3 includes an optical switch 106 in the optical path between the resonator mirror 103 and the laser crystal 102 of the optical resonator of the laser light source unit 100.

When the laser light source unit 100 performs a laser oscillation, the optical switch 106 changes its transmittance based on a signal from a controller of an unillustrated exterior apparatus. When the optical switch 106 has a high transmittance, the laser light source unit 100 outputs the laser beam. E2 through the resonator mirror 104. When the optical switch 106 has a low transmittance and the loss exceeds the gain in the optical resonator in the laser light source unit 100, the laser oscillation stops. Periodically changing the transmittance of the optical switch 106 included in the laser light source unit 100 allows the pulsed laser beam E2 to be outputted through the resonator mirror 104 in synchronization with the change in the transmittance of the optical switch 106. In other aspects, the configuration and operation of the laser apparatus 3 of the second modified example are substantially the same as those of the laser apparatus 3 shown in FIG. 3. For the laser apparatus 3 according to the second modified example, a description of the configuration and operation substantially the same as those of the laser apparatus 3 shown in FIG. 3 is omitted.

4. Second Embodiment

4.1 Configuration

Figure 9:
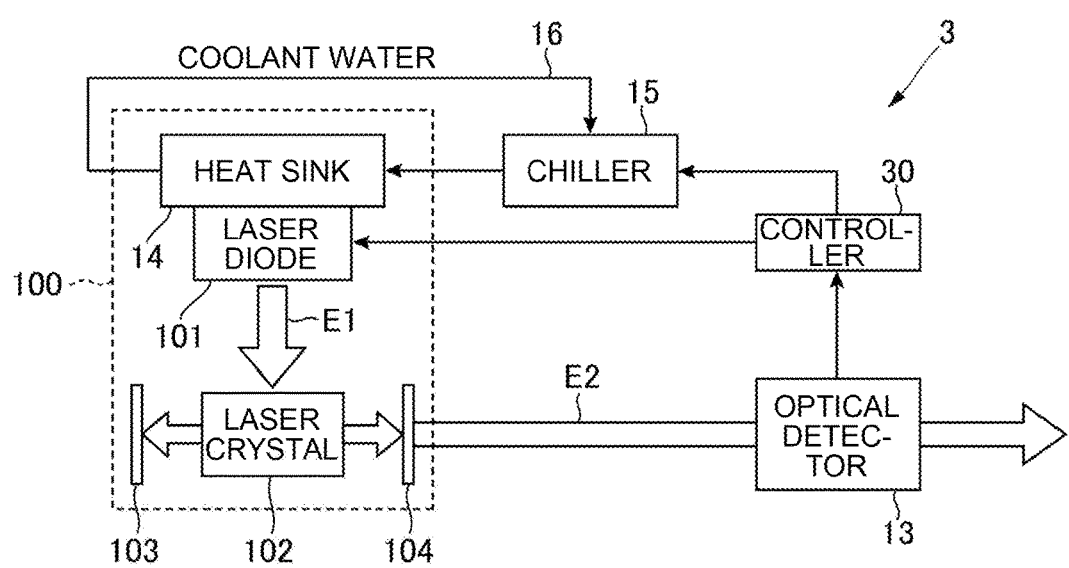
FIG. 9 shows a laser apparatus according to a second embodiment.

FIG. 9 shows a laser apparatus 3 according to a second embodiment.

The laser apparatus 3 according to the second embodiment shown in FIG. 9 does not include the attenuator 12 in the optical path between the laser light source unit 100 and the optical detector 13. In the laser apparatus 3 according to the second embodiment, the laser beam E2 outputted from the laser light source unit 100 is outputted as the laser beam from the laser apparatus 3. The laser apparatus 3 according to the second embodiment includes a controller 30 instead of the controller 20.

The controller 30 performs, similarly to the controller 20, a process of keeping the output power of the laser beam. Based on the detection signal from the optical detector 13, the controller 30 changes the standard temperature of the coolant water. The controller 30 then sends a new standard temperature to the chiller 15. In addition, the controller 30 controls the electric current supplied to the laser diode 101 based on the detected output power P of the laser beam E2 to control the output power P of the laser beam E2.

In other aspects, the configuration of the laser apparatus 3 according to the second embodiment is substantially the same as the configuration of the laser apparatus 3 shown in FIG. 3. For the laser apparatus 3 according to the second embodiment, a description of the configuration substantially the same as the configuration of the laser apparatus 3 shown in FIG. 3 is omitted.

4.2 Operation

Figure 10:
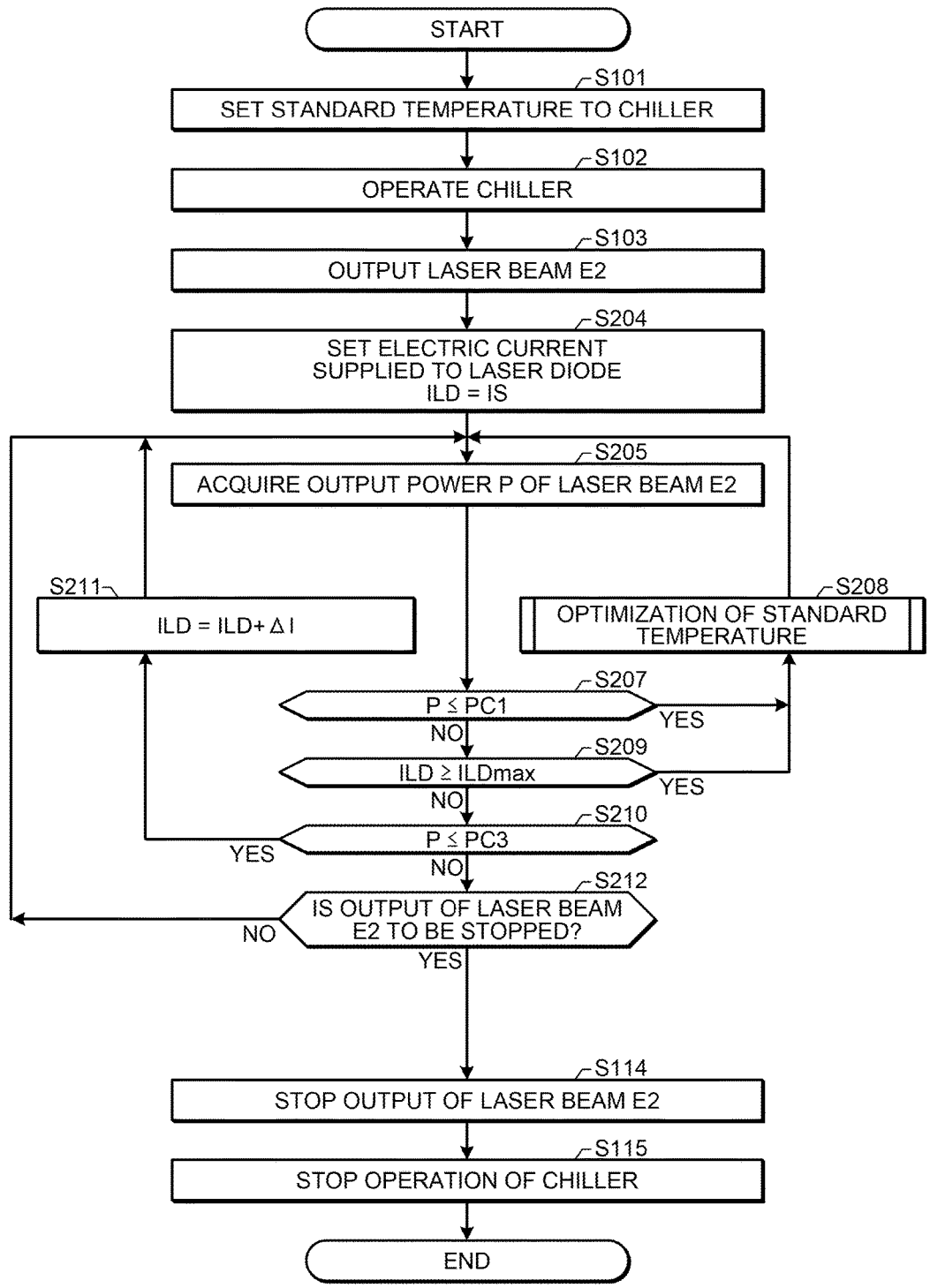
FIG. 10 is a flowchart of a process of keeping the output power of the laser beam from the laser apparatus according to the second embodiment.

FIG. 10 is a flowchart showing the process of keeping the output power of the laser beam in the laser apparatus 3 according to the second embodiment.

The process of keeping the output power of the laser beam is described below with reference to FIG. 10. For the process of keeping the output power of the laser beam in the laser apparatus 3 according to the second embodiment, a description of the operation substantially the same as the operation of the laser apparatus 3 according to the first embodiment shown in FIG. 5 is omitted.

After the laser light source unit 100 starts output of the laser beam E2 in the process of S103, the controller 30 sets an electric current MD supplied to the laser diode 101 to a standard electric current IS (S204).

The optical detector 13 detects the output power P of the laser beam E2 outputted from the laser light source unit 100. The optical detector 13 outputs the detection signal according to the output power of the laser beam E2. The controller 30 receives the detection signal outputted from the optical detector 13 to acquire data on the output power P of the laser beam E2 (S205).

The controller 30 determines whether or not the detected output power P of the laser beam E2 is equal to or lower than the threshold output power PC1 (S207). The threshold output power PC1 has, for example, a value of 80% of the maximum output power Pmax of the laser beam E2.

If the detected output power P of the laser beam E2 is equal to or lower than the threshold output power PC1 (S207: YES), the controller 30 performs a process of optimization of the standard temperature (S208). A flowchart of the process of optimization of the standard temperature will be described below. After the process of optimization of the standard temperature, the controller 30 returns to the process of S205.

If the detected output power P of the laser beam E2 is higher than the threshold output power PC1 (S207: NO), the controller 30 determines whether or not the electric current ILD supplied to the laser diode 101 is equal to or higher than the maximum electric current ILDmax (S209).

If the electric current ILD is equal to or higher than the maximum electric current ILDmax (S209: YES), the controller 30 performs the process of optimization of the standard temperature (S208).

If the electric current ILD is lower than the maximum electric current ILDmax (S209: NO), the controller 30 determines whether or not the detected output power P of the laser beam E2 is equal to or lower than a third threshold output power PC3 (S210). Similarly to the second threshold output power PC2, the third threshold output power PC3 is higher than the threshold output power PC1 and lower than the maximum output power Pmax. The third threshold output power PC3 has, for example, a value of 99% of the maximum output power Pmax of the laser beam. E2.

If the detected output power P of the laser beam E2 is equal to or lower than the third threshold output power PC3 (S210: YES), the controller 30 adds a predetermined electric current change amount ΔI to the electric current ILD (S211). After adding the electric current change amount ΔI to the electric current ILD, the controller 30 returns to the process of S205.

If the detected output power P of the laser beam E2 is higher than the third threshold output power PC3 (S210: NO), the controller 30 determines whether it has received the command of stopping the output of the laser beam E2 (S212).

If the controller 30 has received the command of stopping the output of the laser beam E2 (S212: YES), the controller 30 executes the process of S114 and S115 as described with reference to FIG. 5 and ends the process of keeping the output power of the laser beam.

If the controller 30 has not received the command of stopping the output of the laser beam E2 (S212: NO), the controller 30 returns to the process of S205.

The process of optimization of the standard temperature of the coolant water supplied by the chiller 15 is described below with reference to FIG. 11.

Figure 11:
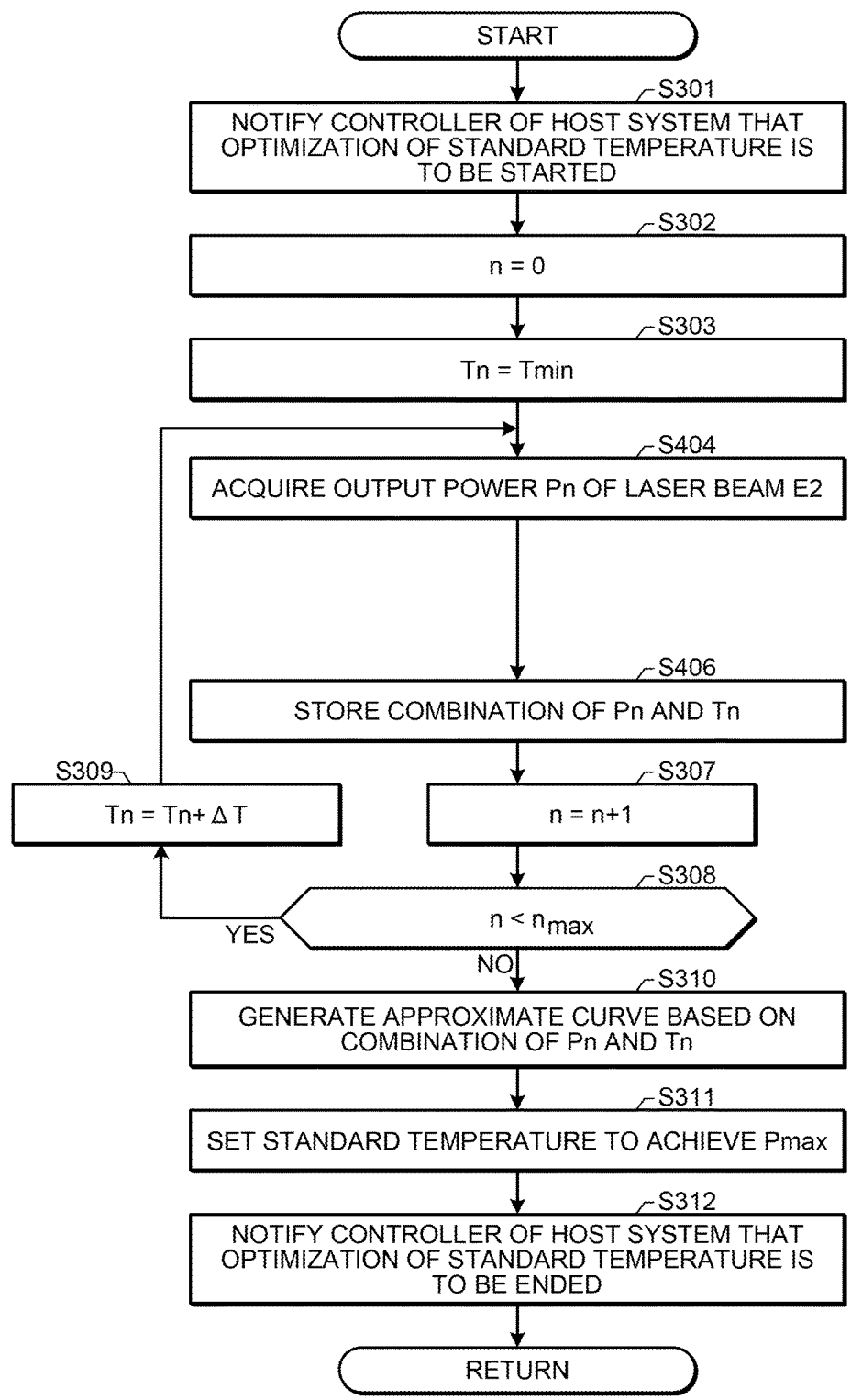
FIG. 11 is a flowchart of a process of optimization of the standard temperature of the coolant water set for the chiller in the process of keeping the output power of the laser beam shown in FIG. 10.

FIG. 11 is a flowchart of the process of optimization of the standard temperature of the coolant water supplied by the chiller 15 in the process of keeping the output power of the laser beam shown in FIG. 10.

For the process of optimization of the standard temperature of the coolant water supplied by the chiller 15 in the laser apparatus 3 according to the second embodiment, a description of the operation substantially the same as the operation of the laser apparatus 3 according to the first embodiment shown in FIG. 6 is omitted.

After the process of S303, the optical detector 13 detects the output power Pn of the laser beam E2 outputted from the laser light source unit 100. The optical detector 13 outputs the detection signal according to the output power Pn of the laser beam E2. The controller 30 receives the detection signal outputted from the optical detector 13 to acquire data on the output power Pn of the laser beam. E2 (S404).

The controller 30 stores a combination of the acquired data on the output power Pn of the laser beam E2 and the preset temperature Tn of the coolant water (S406). The controller 30 executes the process of S307 and subsequent process shown in FIG. 6.

In other aspects, the operation of the laser apparatus 3 according to the second embodiment is substantially the same as the operation of the laser apparatus 3 shown in FIGS. 5 and 6. For the laser apparatus 3 according to the second embodiment, a description of the operation substantially the same as the operation of the laser apparatus 3 shown in FIGS. 5 and 6 is omitted.

4.3 Effect

In the laser apparatus 3 according to the second embodiment, even where the maximum output power Pmax cannot be achieved by controlling the electric current ILD supplied to the laser diode 101, a desired output power of the laser beam E2 can be achieved by changing the standard temperature of the coolant water supplied by the chiller 15. Namely, the laser apparatus 3 according to the second embodiment, which controls the electric current supplied to the laser diode 101 and the standard temperature of the coolant water supplied by the chiller 15 in harmony, may achieve the desired output power of the laser beam E2.

4.4 Modified Example

Figure 12:
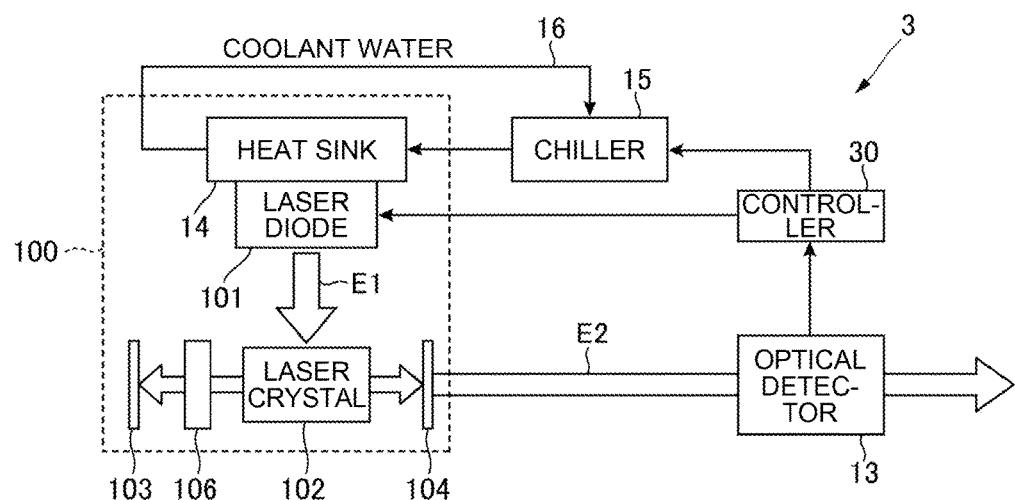
FIG. 12 shows a modified example of the laser apparatus according to the second embodiment.

FIG. 12 shows a modified example of the laser apparatus 3 according to the second embodiment.

As in the modified example of the second embodiment shown in FIG. 12, the laser apparatus 3 may be a Q-switched laser. The laser apparatus 3 includes an optical switch 106 in the optical path between the resonator mirror 103 and the laser crystal 102 of the optical resonator of the laser light source unit 100.

The operation of the laser light source unit 100 including the optical switch 106 is substantially the same as the operation of the laser apparatus 3 shown in FIG. 8.

In other aspects, the configuration and operation of the laser apparatus 3 according to the modified example are substantially the same as those of the laser apparatus 3 shown in FIG. 9. For the laser apparatus 3 according to the modified example, a description of the configuration and operation substantially the same as those of the laser apparatus 3 shown in FIG. 9 is omitted.

5. Third Embodiment

5.1 Configuration and Operation

A configuration of a laser apparatus 3 according to the third embodiment is described below with reference to FIG. 13.

Figure 13:
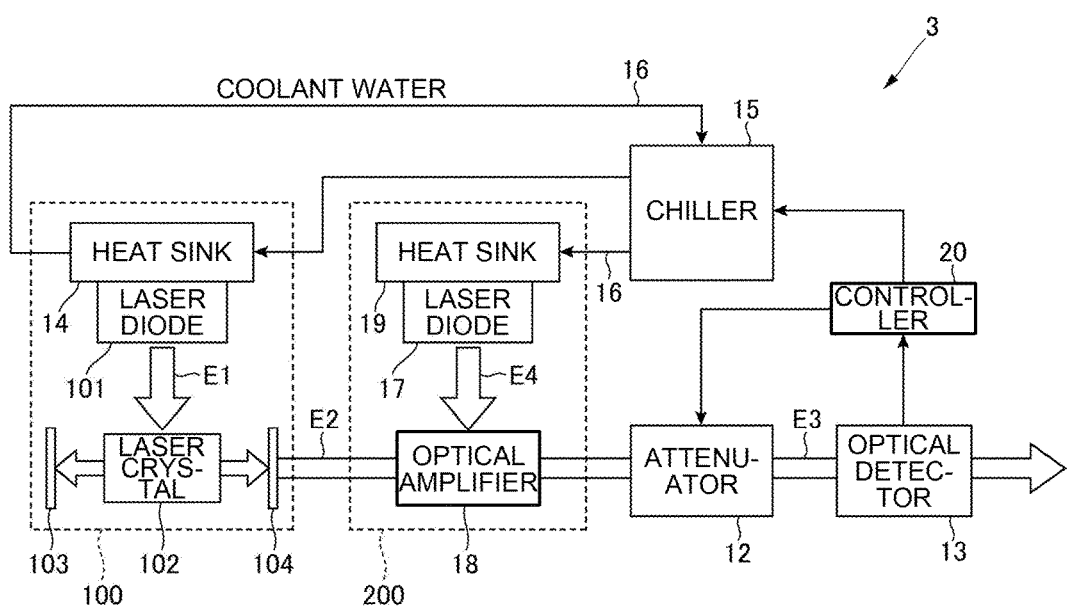
FIG. 13 shows a laser apparatus according to a third embodiment.

FIG. 13 shows a laser apparatus 3 according to the third embodiment.

The laser apparatus 3 according to the third embodiment includes a laser amplifier 200 provided in the optical path between the laser light source unit 100 and the attenuator 12 and configured to amplify the laser beam E2 from the laser light source unit 100.

The laser amplifier 200 includes a laser diode 17 to emit excitation light E4, an optical amplifier 18 in which a laser crystal is excited by the excitation light E4 to amplify the laser beam E2, and a heat sink 19 connected to the laser diode 17 to cool the laser diode 17.

The heat sinks 14 and 19 give heat from the laser diodes 101 and 17, respectively, to the coolant water supplied by the chiller 15. Each of the temperatures of the laser diodes 101 and 17 is thus adjusted to a preset temperature. The chiller 15 may adjust the temperatures of the laser diodes 101 and 17 to the same temperature. Alternatively, the chiller 15 may adjust the temperatures of the laser diodes 101 and 17 to different temperatures from each other.

In other aspects, the configuration and operation of the laser apparatus 3 according to the third embodiment are substantially the same as those of the laser apparatus 3 shown in FIG. 3. For the laser apparatus 3 according to the third embodiment, a description of the configuration and operation substantially the same as those of the laser apparatus 3 shown in FIG. 3 is omitted.

The laser apparatus 3 according to the third embodiment may perform the operation described with reference to FIGS. 5 and 6 for either one of the laser light source unit 100 and the laser amplifier 200.

Alternatively, the laser apparatus 3 according to the third embodiment may perform the operation described with reference to FIGS. 5 and 6 for both of the laser light source unit 100 and the laser amplifier 200. In this case, the laser apparatus 3 according to the third embodiment may firstly set the temperature of the laser diode 101 and then set the temperature of the laser diode 17.

5.2 Effect

The laser apparatus 3 according to the third embodiment cools the laser diode 17 of the laser amplifier 200 using the chiller 15 in which the standard temperature is controlled by the controller 20. The performance of the laser amplifier 200 may thus be stable.

6. Fourth Embodiment

6.1 Configuration

Figure 14:
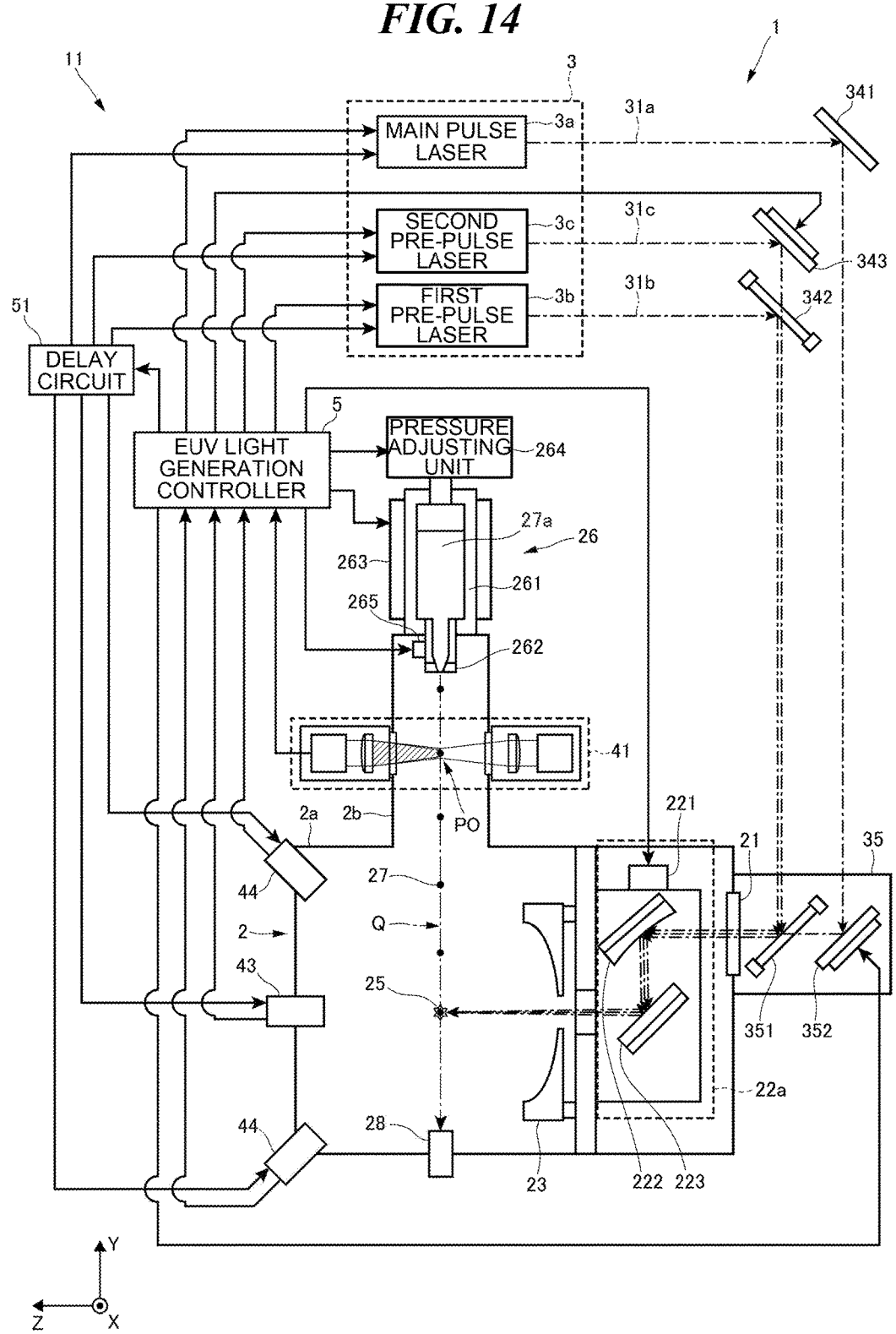
FIG. 14 schematically shows a configuration of an EUV light generating system according to a fourth embodiment.

FIG. 14 schematically shows a configuration of an EUV light generating system 11 according to a fourth embodiment.

The EUV light generating system 11 includes an EUV light generating apparatus 1 and a laser apparatus 3. The EUV light generating apparatus 1 includes an EUV light generation controller 5, a delay circuit 51, an EUV chamber 2, high-reflective mirrors 341 and 343, a mirror 342, and a beam combiner 35. The laser apparatus 3 includes a main pulse laser 3a, a first pre-pulse laser 3b, and a second pre-pulse laser 3c.

Each of the first pre-pulse laser 3b and the second pre-pulse laser 3c in the EUV light generating system 11 has the same configuration as the laser apparatus 3 according to any one of the embodiments described above.

The first pre-pulse laser 3b may have the same configuration as the laser apparatus 3 shown in FIG. 7 or FIG. 13. Alternatively, the first pre-pulse laser 3b may be an apparatus where the laser apparatus 3 shown in FIG. 7 is combined with the laser amplifier 200 of the laser apparatus 3 shown in FIG. 13.

The second pre-pulse laser 3c may have the same configuration as the laser apparatus 3 shown in FIG. 8 or FIG. 12. Alternatively, the second pre-pulse laser 3c may be an apparatus where the laser apparatus 3 shown in FIG. 8 is combined with the laser amplifier 200 of the laser apparatus 3 shown in FIG. 13.

The beam combiner 35 includes a high-reflective mirror 352 and a dichroic mirror 351. The beam combiner 35 is fixed to the EUV chamber 2. The dichroic mirror 351 includes a diamond substrate having a surface coated with a film to reflect first and second pre-pulse laser beams 31b and 31c at a high reflectance and to transmit a main pulse laser beam 31a.

The EUV chamber 2 is accompanied by a laser beam focusing optical system 22a, an EUV collector mirror 23, a target supply unit 26, a target detecting unit 41, EUV light detecting sensors 44, and a target detecting image sensor 43.

The target supply unit 26 is constituted and arranged to supply a droplet-shaped target 27 to a plasma generation region 25.

The target detecting unit 41 is constituted and arranged to detect that the target 27 has passed through a predetermined position PO before the target 27 reaches the plasma generation region 25.

The laser beam focusing optical system 22a includes an off-axis paraboloidal mirror 222, a planar mirror 223, and a stage 221 to move in an X-axis direction, a Y-axis direction, and a Z-axis direction. The laser beam focusing optical system 22a is provided in the EUV chamber 2. The off-axis paraboloidal mirror 222 and the planar mirror 223 are constituted and arranged such that the focus position of the laser beam substantially coincides with the plasma generation region 25.

The high-reflective mirrors 341 and 352 are provided such that the main pulse laser beam 31a is transmitted by the dichroic mirror 351 and a window 21 and enters the laser beam focusing optical system 22a.

The mirror 342 and the high-reflective mirror 343 are provided such that each of the first and second pre-pulse laser beams 31b and 31c is reflected by the dichroic mirror 351 at a high reflectance, transmitted by the window 21, and enters the laser beam focusing optical system 22a. The first and second pre-pulse laser beams 31b and 31c may have different states of polarization from each other. These beams may have polarizing directions perpendicular to each other. The mirror 342 may be a polarizing beam splitter to reflect the first pre-pulse laser beam 31b and transmit the second pre-pulse laser beam 31c.

The dichroic mirror 351 and the high-reflective mirror 352 are provided such that the optical path of the main pulse laser beam 31a and the optical paths of the first and second pre-pulse laser beams 31b and 31c substantially coincide with each other after being combined by the dichroic mirror 351.

A passage timing signal outputted from the target detecting unit 41 is inputted to the delay circuit 51 via the EUV light generation controller 5. Oscillation trigger signals are generated based on the passage timing signal and inputted to the main pulse laser 3a, the first pre-pulse laser 3b, and the second pre-pulse laser 3c.

The EUV light generation controller 5 outputs a delay signal to the delay circuit 51 to set the respective delay times of the laser beams.

The EUV light detecting sensors 44 are provided at regular intervals along a circumferential direction around the plasma generation region 25. Each of the EUV light detecting sensors 44 detects the pulse energy of the EUV light.

The target detecting image sensor 43 photographs the plasma generation region 25 at a predetermined timing for a predetermined period of time.

6.2 Operation

The EUV light generation controller 5 preliminary sends to the delay circuit 51 the delay signal to set target values. The target values include first to third delay times for the first pre-pulse laser 3b, the second pre-pulse laser 3c, and the main pulse laser 3a, respectively.

The delay signal sent from the EUV light generation controller 5 to the delay circuit 51 sets the first to third delay times as follows. The first delay time is set such that the first pre-pulse laser beam 31b is incident on the target 27 at the time when the target 27 reaches the plasma generation region 25 after the passage timing signal is inputted from the target detecting unit 41. The second delay time is set such that the second pre-pulse laser beam 31c is incident on a secondary target at the time of elapsing a first predetermined period from the time when the first pre-pulse laser beam 31b is incident on the target 27. The third delay time is set such that the main pulse laser beam 31a is incident on a tertiary target at the time of elapsing a second predetermined period from the time when the second pre-pulse laser beam 31c is incident on the secondary target. Here, the secondary target is, for example, a target spread in a mist. The mist is defined as a state where the target 27 is broken by the first pre-pulse laser beam 31b and diffused as micro-droplets, clusters, or the like. The tertiary target is, for example, a target where the micro-droplets or the like are further broken and diffused.

The EUV light generation controller 5 sends setting values to the first and second pre-pulse lasers 3b and 3c. The setting values may include pulse energy or pulse width of the first and second pre-pulse laser beams 31b and 31c.

The EUV light generation controller 5 sends setting values to the main pulse laser 3a. The setting values may include pulse energy, pulse width, or a pulse waveform of the main pulse laser beam 31a.

Upon receiving a signal from an exposure apparatus to generate the EUV light, the EUV light generating system 11 sends a target generation signal to the EUV light generation controller 5.

The EUV light generation controller 5 controls a heater 263 of the target supply unit 26 to heat target material 27a in a tank 261 to a temperature higher than the melting point of the target material 27a, causing the target material 27a to be melt. If the target material 27a is Sn, which has the melting point of 232° C., the temperature of the target material 27a heated by the heater 263 is, for example, 280° C.

The EUV light generation controller 5 further controls a pressure adjusting unit 264 such that a predetermined pressure is applied to the target material 27a in the tank 261. Controlling the pressure applied to the target material 27a in the tank 261 causes the target 27 to be repeatedly outputted at a predetermined speed through a nozzle 262.

The EUV light generation controller 5 sends an electric signal having a predetermined waveform to a piezoelectric element 265 attached to the nozzle 262. As a result, the droplet-shaped target 27 is repeatedly generated in the EUV chamber 2 at a predetermined repetition frequency.

When the target 27 reaches the position PO where the target 27 is detected by the target detecting unit 41, the target detecting unit 41 detects the target 27 and outputs the passage timing signal. The passage timing signal is inputted to the delay circuit 51 via the EUV light generation controller 5.

The delay circuit 51 outputs a first oscillation trigger signal at the first delay time from the time when the passage timing signal is inputted. The first oscillation trigger signal is inputted to the first pre-pulse laser 3b. The first pre-pulse laser beam 31b is outputted based on the first oscillation trigger signal from the first pre-pulse laser 3b at a predetermined pulse energy or a predetermined pulse width.

The delay circuit 51 outputs a second oscillation trigger signal at the second delay time from the time when the passage timing signal is inputted. The second oscillation trigger signal is inputted to the second pre-pulse laser 3c. The second pre-pulse laser beam 31c is outputted based on the second oscillation trigger signal from the second pre-pulse laser 3c at a predetermined pulse energy or a predetermined pulse width.

The first and second pre-pulse laser beats 31b and 31c are reflected or transmitted by the mirror 342, then reflected by the dichroic mirror 351, and then inputted to the EUV chamber 2 via the window 21. The first and second pre-pulse laser beams 31b and 31c are concentrated into the plasma generation region 25 at predetermined spot diameters D1 and D2, respectively, by the laser beam focusing optical system 22a.

The delay circuit 51 outputs a third oscillation trigger signal to the main pulse laser 3a at the third delay time from the time when the passage timing signal is inputted. The main pulse laser beam 31a is outputted based on the third oscillation trigger signal from the main pulse laser 3a at a predetermined pulse energy, a predetermined pulse width, or a predetermined pulse waveform. The main pulse laser beam 31a is reflected by the high-reflective mirrors 341 and 352, and transmitted by the dichroic mirror 351 at a high transmittance.

The optical path axis of the main pulse laser beam 31a and the optical path axes of the first and second pre-pulse laser beams 31b and 31c are thus adjusted to substantially coincide with each other.

The main pulse laser beam 31a is inputted to the EUV chamber 2 via the window 21. The main pulse laser beam 31a is concentrated by the laser beam focusing optical system 22a at a predetermined spot diameter Dm and incident on the tertiary target. The tertiary target is then turned into plasma to generate the EUV light.

The EUV light detecting sensors 44 detect the pulse energy of the EUV light and output the detected values to the EUV light generation controller 5. The EUV light generation controller 5 may calculate an average of the detected values detected by two or more EUV light detecting sensors 44.

The target detecting image sensor 43 receives a gate signal synchronizing the EUV light generation from the EUV light generation controller 5. The target detecting image sensor 43 photographs the plasma generation region 25 for a predetermined length of time. The target detecting image sensor 43 may vary the timing from the gate signal as follows to photograph the target 27, the secondary target, the tertiary target, and the plasma.

For example, the EUV light generation controller 5 may perform an analysis of the image of the photographed target 27. To allow the target 27 in the predetermined states of diffusion to be in a predetermined position in the area to be photographed, the EUV light generation controller 5 may adjust the delay time of photographing the target 27 or the delay time of the oscillation trigger signal inputted to each laser apparatus. Substantially the same adjustments may be performed for the image of the secondary target, the image of the tertiary target, or the image of the plasma.

6.3 Effect

The EUV light generating system 11 according to the fourth embodiment needs to be operated for a long time. The EUV light generating system 11 using the laser apparatus 3 according to the embodiments described above may stably achieve desired output power of the laser beam even where the relationship between the output power of the laser beam and the temperature of the coolant water changes in the operating time of the EUV light generating system 11. The stability in the output power of the laser beam contributes to improve the stability of the output power of the EUV light. Accordingly, the EUV light generating system 11 using the laser apparatus 3 according to the fourth embodiment may perform stable output of the EUV light for a long time.

7. Others

For each of the embodiments described above including the modified examples, it would be clear for those skilled in the art that any part of the embodiment may be adapted to another embodiment.

In the laser apparatus 3, the optical detector 13 detects the output power of the laser beam E3 transmitted by the attenuator 12 or the laser beam E2 outputted from the laser light source unit 100. However, the position of the optical detector is not limited to this. In the laser apparatus 3 of the present disclosure, the optical detector may be provided, for example, in the optical path between the resonator mirror 103 or 104 and the laser crystal 102 to detect the light in the resonator. Based on the results of the detection of the light in the resonator, the standard temperature of the coolant water supplied by the chiller 15 may be changed. Further, the optical detector 13 detects the output power of the laser beam E3. However, the parameters to be detected by the optical detector are not limited to this. In the laser apparatus 3 of the present disclosure, the optical detector may detect, for example, the wavelength of the laser beam E3.

The above descriptions are intended to be only illustrative rather than being limiting. Accordingly, it would be clear to those skilled in the art that various changes may be made to the embodiments of the present disclosure without departing from the scope of the appended claims.

The terms used in this specification and the appended claims are to be interpreted as not being limiting. For example, the term "include" or "be included" should be interpreted as not being limited to items described as being included. Further, the term "have" should be interpreted as not being limited to items described as being had. Furthermore, the modifier "a" or "an" as used in this specification and the appended claims should be interpreted as meaning "at least one" or "one or more".

Reference symbols are listed below.
1: EUV light generating apparatus
2: EUV chamber
3: Laser apparatus
3a: Main pulse laser
3b: First pre-pulse laser
3c: Second pre-pulse laser
5: EUV light generation controller
10: Controller
11: EUV light generating system
12: Attenuator
13: Optical detector
14: Heat sink
15: Chiller
16: Coolant water channel
17: Laser diode
18: Optical amplifier
19: Heat sink
20: Controller
21: Window
22a: Laser beam focusing optical system
23: EUV collector mirror
25: Plasma generation region
26: Target supply unit
27: Target
30: Controller
31a: Main pulse laser beam
31b: First pre-pulse laser beam 31c: Second pre-pulse laser beam
35: Beam combiner
41: Target detecting unit
43: Target detecting image sensor
44: EUV light detecting sensor
51: Delay circuit
100: Laser light source unit
101: Laser diode
102: Laser crystal
103: Resonator mirror
104: Resonator mirror
105: Saturable absorber
106: Optical switch
200: Laser amplifier
221: Stage
222: Off-axis paraboloidal mirror
223: Planar mirror
261: Tank
262: Nozzle
263: Heater
264: Pressure adjusting unit
265: Piezoelectric element
341: High-reflective mirror
342: Mirror
343: High-reflective mirror
351: Dichroic mirror
352: High-reflective mirror

The invention claimed is:

1. A laser apparatus comprising:
a light source configured to output excitation light;
an optical resonator in which laser medium is excited by the excitation light, the optical resonator being configured to output laser beam;
a temperature regulator configured to adjust temperature of the light source to a standard temperature;
an attenuator configured to limit output power of the laser beam transmitted by the attenuator;
an optical detector configured to detect the output power of the laser beam transmitted by the attenuator; and
a controller configured to
calculate output power of the laser beam outputted from the optical resonator based on both the detected output power of the laser beam transmitted by the attenuator and transmittance of the attenuator for the laser beam,
change the standard temperature based on a relationship between the calculated output power of the laser beam and the temperature of the light source when the calculated output power of the laser beam is equal to or lower than a threshold output power, and
change the transmittance of the attenuator for the laser beam when the calculated output power of the laser beam is equal to or lower than a second threshold output power, the second threshold output power being higher than the threshold output power.

2. The laser apparatus according to claim 1, wherein the controller changes the standard temperature based on the relationship between the calculated output power of the laser beam and the temperature of the light source, such that the output power of the laser beam reaches a maximum output power.

3. The laser apparatus according to claim 1, wherein
the attenuator is controlled to change the transmittance for the laser beam by voltage applied to the attenuator; and
the controller controls the voltage applied to the attenuator.

4. The laser apparatus according to claim 3, wherein the controller changes the standard temperature based on results of comparing the voltage applied to the attenuator with a voltage where the transmittance of the attenuator has a maximum value.

5. A laser apparatus comprising:
a light source configured to output excitation light;
an optical resonator in which laser medium is excited by the excitation light, the optical resonator being configured to output laser beam;
a temperature regulator configured to adjust temperature of the light source to a standard temperature;
an optical detector configured to detect output power of the laser beam; and
a controller configured to change the standard temperature based on a relationship between the detected output power of the laser beam and the temperature of the light source when the detected output power of the laser beam is equal to or lower than a threshold output power, wherein
the controller controls the output power of the laser beam by controlling electric current supplied to the light source when the detected output power of the laser beam is equal to or lower than a second threshold output power, the second threshold output power being higher than the threshold output power.

6. The laser apparatus according to claim 5, wherein the controller changes the standard temperature when the electric current supplied to the light source is equal to or higher than a maximum electric current.

7. The laser apparatus according to claim 1, wherein the temperature regulator is a heat exchanger to perform heat exchanging to cool a heat exchange medium, the temperature regulator adjusting the temperature of the heat exchange medium to the standard temperature to adjust the temperature of the light source.

8. The laser apparatus according to claim 1, further comprising:
a laser amplifier provided in an optical path of the laser beam and configured to amplify the laser beam, wherein
the laser amplifier includes a light source to output second excitation light, and an optical amplifier in which laser medium is excited by the second excitation light, the optical amplifier being configured to amplify the laser beam; and
the temperature regulator adjusts temperature of the light source of the laser amplifier to the standard temperature.

9. An extreme ultraviolet light generating system to irradiate a target with a laser beam to generate extreme ultraviolet light, comprising:
a laser apparatus configured to output the laser beam; and
a chamber that the laser beam enters, the extreme ultraviolet light being generated in the chamber, wherein
the laser apparatus comprises:
a light source configured to output excitation light;
an optical resonator in which laser medium is excited by the excitation light, the optical resonator being configured to output the laser beam;
a temperature regulator configured to adjust temperature of the light source to a standard temperature;
an attenuator configured to limit output power of the laser beam transmitted by the attenuator;
an optical detector configured to detect the output power of the laser beam transmitted by the attenuator; and a controller configured to
    calculate output power of the laser beam outputted from the optical resonator based on both the detected output power of the laser beam transmitted by the attenuator and transmittance of the attenuator for the laser beam,
    change the standard temperature based on a relationship between the calculated output power of the laser beam and the temperature of the light source when the calculated output power of the laser beam is equal to or lower than a threshold output power, and
    change the transmittance of the attenuator for the laser beam when the calculated output power of the laser beam is equal to or lower than a second threshold output power, the second threshold output power being higher than the threshold output power.

10. The extreme ultraviolet light generating system according to claim 9, further comprising:
a target supply unit configured to supply the target to the chamber, wherein
the laser apparatus irradiates the target with a pre-pulse laser beam as the laser beam before irradiating the target with a main pulse laser beam.

11. The laser apparatus according to claim 5, wherein the controller changes the standard temperature based on the relationship between the detected output power of the laser beam and the temperature of the light source, such that the output power of the laser beam reaches a maximum output power.

12. The laser apparatus according to claim 5, wherein the temperature regulator is a heat exchanger to perform heat exchanging to cool a heat exchange medium, the temperature regulator adjusting the temperature of the heat exchange medium to the standard temperature to adjust the temperature of the light source.

* * * * *